(12) United States Patent
Inaba et al.

(10) Patent No.: US 9,693,485 B2
(45) Date of Patent: Jun. 27, 2017

(54) COOLING SYSTEM FOR ELECTRONIC DEVICE STORING APPARATUS AND COOLING SYSTEM FOR ELECTRONIC DEVICE STORING BUILDING

(71) Applicant: NEC Corporation, Tokyo (JP)

(72) Inventors: Kenichi Inaba, Tokyo (JP); Minoru Yoshikawa, Tokyo (JP); Hitoshi Sakamoto, Tokyo (JP); Akira Shoujiguchi, Tokyo (JP); Arihiro Matsunaga, Tokyo (JP); Masaki Chiba, Tokyo (JP)

(73) Assignee: NEC Corporation, Tokyo (JP)

( * ) Notice: Subject to any disclaimer, the term of this patent is extended or adjusted under 35 U.S.C. 154(b) by 78 days.

(21) Appl. No.: 14/646,599

(22) PCT Filed: Dec. 3, 2013

(86) PCT No.: PCT/JP2013/007069
§ 371 (c)(1),
(2) Date: May 21, 2015

(87) PCT Pub. No.: WO2014/087635
PCT Pub. Date: Jun. 12, 2014

(65) Prior Publication Data
US 2015/0305209 A1    Oct. 22, 2015

(30) Foreign Application Priority Data

Dec. 3, 2012   (JP) .................................. 2012-264430

(51) Int. Cl.
*H05K 7/20* (2006.01)
*G06F 1/20* (2006.01)
(Continued)

(52) U.S. Cl.
CPC ..... *H05K 7/20818* (2013.01); *F28D 15/0266* (2013.01); *F28D 15/06* (2013.01);
(Continued)

(58) Field of Classification Search
CPC ........... H05K 7/20818; H05K 7/20736; H05K 7/20809; F28D 15/0266; F28D 15/06; G06F 1/20
(Continued)

(56) References Cited

U.S. PATENT DOCUMENTS 4,843,832 A   7/1989  Yamada et al.
6,351,381 B1  2/2002  Bilski et al.
(Continued)

FOREIGN PATENT DOCUMENTS

EP    0281762 A2    9/1988
JP    H05-312361 A  11/1993
(Continued)

OTHER PUBLICATIONS

Extended European Search Report issued by the European Patent Office for Application No. 13860412.9 dated Jul. 6, 2016 (8 pages).
(Continued)

*Primary Examiner* — Anthony Haughton
*Assistant Examiner* — Yahya Ahmad
(74) *Attorney, Agent, or Firm* — Wilmer Cutler Pickering Hale and Dorr LLP

(57) ABSTRACT

A cooling system of an electronic device storing apparatus of the present invention comprises: a rack including an electronic device and a plurality of placement shelves to place the electronic device; in the rack, a vaporizer having a refrigerant internally being mounted; outside the rack, a condensing part connected with the vaporizer by a laying
(Continued)

pipe being installed; and a refrigerant adjustment means for adjusting a height of a refrigerant surface in the vaporizer.

6 Claims, 7 Drawing Sheets

(51) Int. Cl.
    *F28D 15/02*     (2006.01)
    *F28D 15/06*     (2006.01)

(52) U.S. Cl.
    CPC ........... *G06F 1/20* (2013.01); *H05K 7/20736* (2013.01); *H05K 7/20809* (2013.01)

(58) Field of Classification Search
    USPC ........ 361/679.46–679.54, 688–704; 702/130
    See application file for complete search history.

(56) References Cited

U.S. PATENT DOCUMENTS

| | | | |
|---|---|---|---|
| 2005/0075065 A1* | 4/2005 | Nair | F24F 11/0001 454/186 |
| 2005/0126747 A1* | 6/2005 | Chu | H05K 7/2079 165/11.1 |
| 2009/0080173 A1* | 3/2009 | Porter | H05K 7/20827 361/831 |
| 2011/0290448 A1* | 12/2011 | Campbell | F28D 1/0471 165/104.13 |
| 2011/0308262 A1* | 12/2011 | Inadomi | F28D 15/0266 62/126 |
| 2011/0315353 A1* | 12/2011 | Campbell | H05K 7/20809 165/104.31 |
| 2013/0333414 A1* | 12/2013 | Inaba | H05K 7/20681 62/513 |
| 2015/0338281 A1* | 11/2015 | Ross | H05K 7/20836 236/44 A |
| 2016/0018143 A1* | 1/2016 | Inaba | H05K 7/20818 62/527 |

FOREIGN PATENT DOCUMENTS

| | | |
|---|---|---|
| JP | 2011-226737 A | 11/2011 |
| JP | 2012-199300 A | 10/2012 |
| JP | 2013-065227 A | 4/2013 |
| SG | 11201404916V A | 12/2014 |
| WO | WO-2012/029404 A1 | 3/2012 |
| WO | WO-2013/121772 A1 | 8/2013 |

OTHER PUBLICATIONS

International Search Report corresponding to PCT/JP2013/007069 mailed on Feb. 25, 2014 (2 pages).

Singapore Search Report and Written Opinion issued in corresponding Singaporean Application No. 11201504298T, dated Dec. 8, 2015, 9 pages.

Singapore Written Opinion issued in corresponding Singaporean Patent Application No. 11201504298T, dated Aug. 18, 2016, 8 pages.

\* cited by examiner

COOLING SYSTEM FOR ELECTRONIC DEVICE STORING APPARATUS AND COOLING SYSTEM FOR ELECTRONIC DEVICE STORING BUILDING

CROSS-REFERENCE TO RELATED APPLICATIONS

This application is a national stage application of International Application No. PCT/JP2013/007069 entitled "Cooling System for Electronic Device Storing Apparatus and Cooling System for Electronic Device Storing Building," filed on Dec. 3, 2013, which claims the benefit of the priority of Japanese Patent Application No. 2012-264430, filed on Dec. 3, 2012, the disclosures of each of which are hereby incorporated by reference in their entirety.

TECHNICAL FIELD

The present invention relates to a cooling system for an electronic device storing apparatus and the like, and, more particularly, to a cooling system for such as an electronic device storing apparatus which cools heat from a plurality of heating sources such as servers.

BACKGROUND ART

In recent years, an amount of information processing that is needed is increasing along with the improvement of information processing technologies and the development of internet environments. Associated with such tendency, data center business which installs and operates equipment such as servers, communication devices, fixed-line phones and IP (Internet Protocol) telephones that are used for the internet is being paid attention.

A lot of electronic devices such as a computer are installed in a server room of such a data center. As a method to install electronic devices in a server room, using a rack-mounting system is the mainstream. A rack-mounting system is a method standardized by JIS (Japanese Industrial Standards) and EIA (Electronic Industries Alliance), in which flat type electronic devices are installed in a rack in a stacked manner.

In order to reserve a space in a server room sufficiently, it is desired to mount electronic devices into a rack as much as possible. Therefore, it is needed for electronic devices that the heights of them are made to be short respectively. Meanwhile, the height of an electronic device such as a 1 U (Unit) server and a blade server which are generally called a rack-mount type server is about 40 millimeters. In order to cool heat exhausted by such rack-mount type servers, it is necessary to simultaneously cool a plurality of stacked heat sources having different heights.

An underfloor air-conditioning system is a general cooling system for a data center. To cool servers in a data center efficiently, in an underfloor air-conditioning system, a building in which servers are laid is made to have double floors, and cool wind from air-conditioning equipment is supplied to server racks from an under floor through a floor grill, which is provided on a floor surface and is made of a metal plate having a plurality of opened holes. This underfloor air-conditioning system can supply a cool wind to a server rack efficiently because a warm air of a server and a cool wind from air-conditioning equipment can be separated through double floors.

A cooling air volume required for a server rack varies greatly by a load of a server. Therefore, there is disclosed in patent document 1 a structure in which a supplied amount of a cold air that is blown out to the front of a rack is controlled according to a heat generation amount of the rack to reduce motive power for cold air supply and to prevent occurrence of a hot spot.

That is, an average operating rate for each rack is obtained from an operating rate of each server taken in from a control server, the maximum air volume of a rack is multiplied by the average heat generation amount of the rack obtained from that value, and, by that, a signal of a required air volume is generated. Based on this required air volume signal, the number of rotations of a floor fan of each rack is being controlled.

Furthermore, there is provided a temperature correction arithmetic processing part to correct a required air volume signal when an inlet detection temperature of an upper part thermometer provided in a position corresponding to the inlet of a server exceeds an inlet temperature that has been set.

Thus, by obtaining an air volume required for a server from an average operating rate of a server rack and a server inlet air temperature of the uppermost stage of the server rack, a required air volume and a cool wind temperature of air-conditioning equipment are adjusted according to a server operating rate which changes every moment and a cool wind having the most suitable temperature and an air volume is supplied to each server.

CITIZENS LIST

Patent Literature

[PTL 1] Japanese Patent Application Laid-Open No. 2011-226737

SUMMARY OF INVENTION

Technical Problem

However, a cooling system in patent document 1 described above has a problem. That is, this system just supplies an air volume required for servers as a whole by obtaining an average operating rate for each rack from operating rates of servers. Accordingly, heat control of an individual server cannot be made even though a generated heat amount is different depending on each server.

The present invention has been made in consideration of settling these problems, and its object is to provide a cooling system which can control the performance of a heat exchanger in more detail.

Solution to Problem

A cooling system for an electronic device storing apparatus, comprising: a rack including an electronic device and a plurality of placement shelves to place said electronic device; in said rack, a vaporizer having a refrigerant internally being mounted; outside said rack, a condensing part connected with said vaporizer by a laying pipe being installed; and a refrigerant adjustment means for adjusting a height of a refrigerant surface in said vaporizer.

Advantageous Effects of Invention

By a cooling system according to the present invention, a heat exchanger performance can be controlled in more detail.

DESCRIPTION OF EMBODIMENTS

Hereinafter, exemplary embodiments of the present invention will be described in detail with reference to a drawing. However, although limitation that is technically desirable to implement the present invention is made to the exemplary embodiments described below, the scope of the invention is not limited to the followings.

Figure 1:
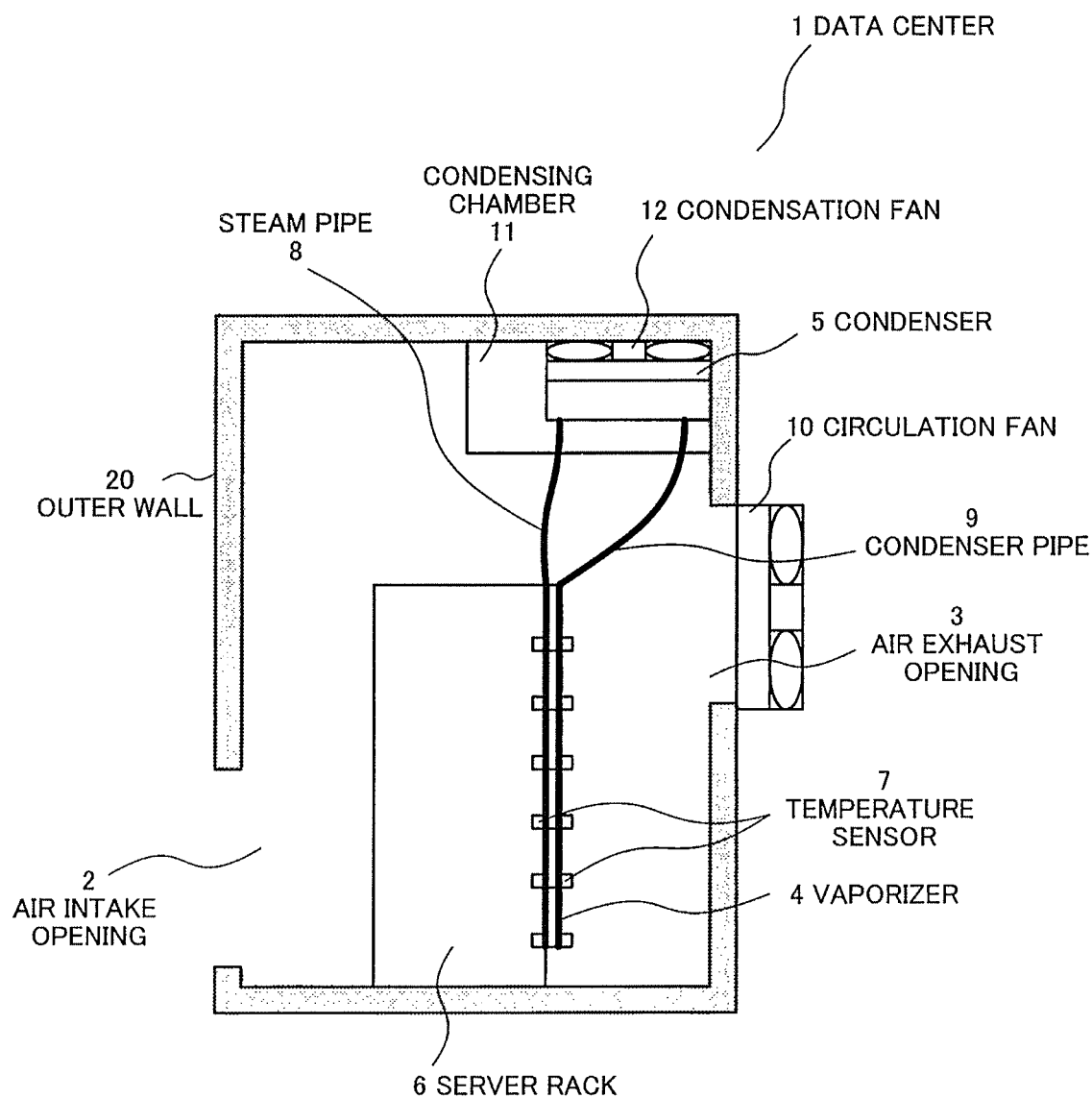
FIG. 1 is a sectional view showing a data center.

FIG. 1 is a sectional view showing a data center. In order to cool servers in a data center 1, a rotary wing of a circulation FAN 10 rotates, and an outside air is taken in from an air intake opening 2 of the data center 1. This outside air that has been taken in is absorbed into a server by a FAN inside the server operating. The air absorbed into the server becomes a warm air by being heated by inner heating elements, and then exhausted from an air exhaust opening of the server.

The warm air conducts heat to a refrigerant 16 in a plurality of heat receiving parts installed in a server rack rear surface, and part of the heat which the warm air has had is absorbed by the refrigerant 16 as a latent heat when the refrigerant 16 performs a phase change to vapor from liquid. Then, the temperature of the warm air declines as a result of losing heat. This warm air is discharged to outside the data center 1 through the circulation FAN 10.

Because a partition or the like does not exist around a server rack, there occurs a so-called short return phenomenon in which part of a warm air which has not been discharged turns around the server rack 6 and is supplied to the air intake part of the server rack 6 again.

By vapor passing through inside a steam pipe 8, the heat from the warm air transferred to the refrigerant in a vaporizer 4 is carried to a condenser 5 in a condensing chamber 11 of the data center 1 by buoyancy. In the condenser 5, the heat of the steam of the refrigerant 16 is carried to outside air by performing heat exchange with the outside air circulated by a condensation FAN 12 of the condensing chamber 11. On this occasion, the vapor is condensed into liquid.

Figure 3:
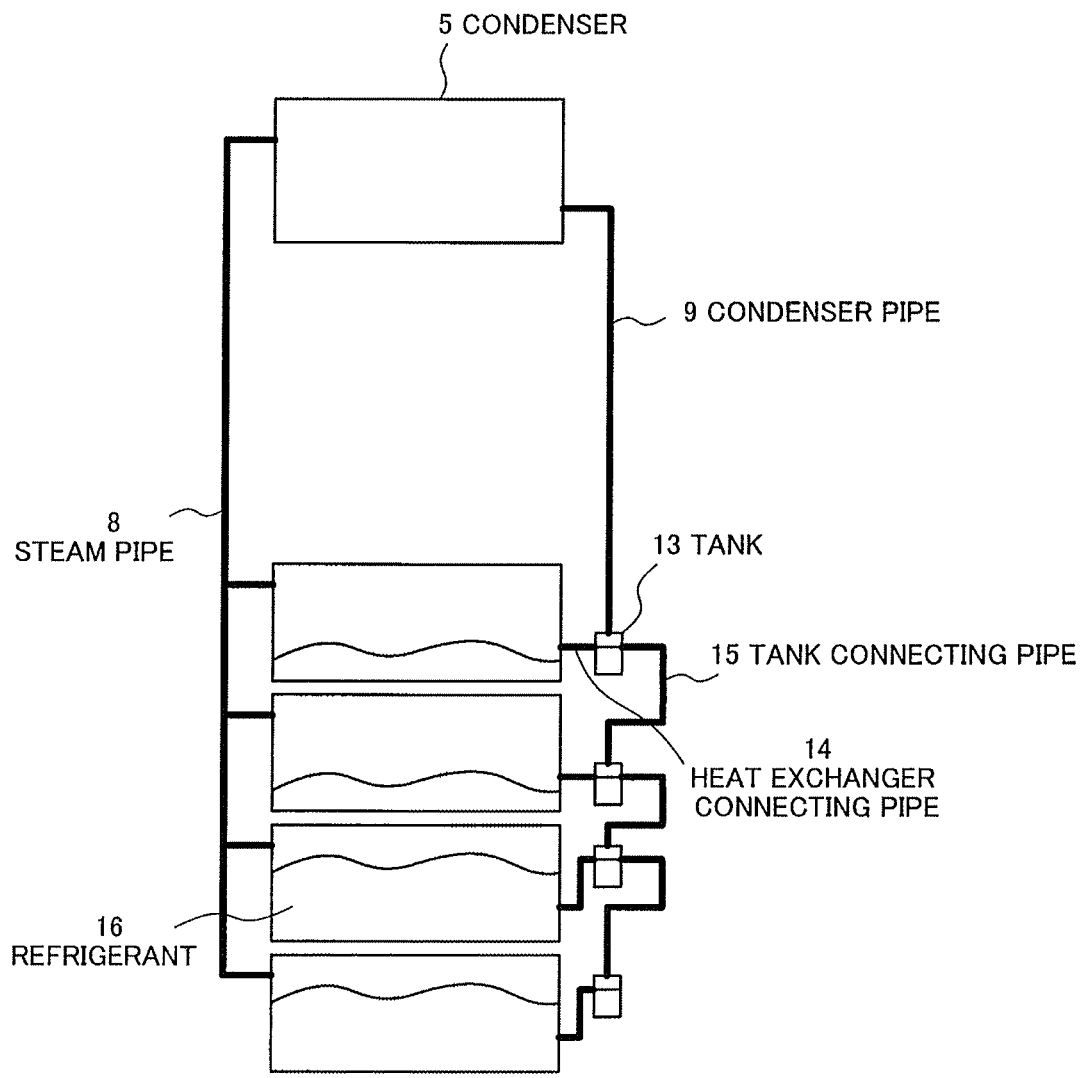
FIG. 3 is a front view of a cooling system.

The condensed refrigerant is carried to a tank 13 in the uppermost part shown in FIG. 3 through a condenser pipe 9. The condensed refrigerant liquid carried to the tank 13 is supplied to the vaporizer of the uppermost stage part through a heat exchanger connecting pipe 14. A tank liquid level rises as a condensed refrigerant liquid goes on being supplied. However, when the tank liquid level rises to the same height as the connecting port of a tank connecting pipe 15 connected to the tank 13, a solvent liquid is connected, not to the heat receiver of the uppermost stage part, but to the tank 13 in a lower stage through the tank connecting pipe 15. A condensed solvent liquid is supplied into all of a plurality of pieces of vaporizer 4 by repeating such operations. Exhaust heat of an electronic device is discharged to outside the data center 1 by the above cycle.

Next, action and effect in this exemplary embodiment will be described with reference to a drawing.

Figure 2:
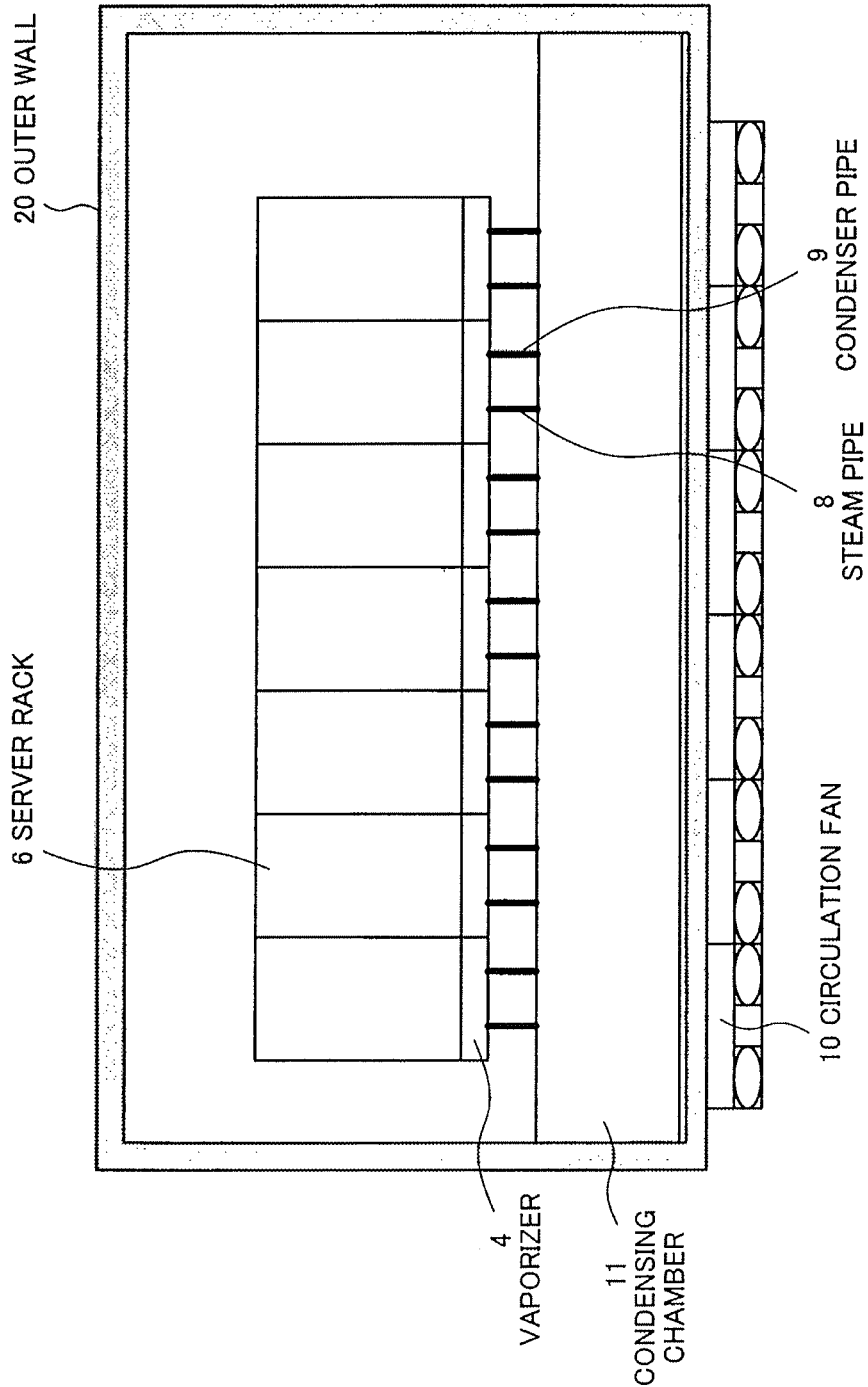
FIG. 2 is an upper part sectional view showing a data center.

First, explanation about how exhaust heat from an electronic device is discharged to outside the data center 1 will be made. In FIG. 1, there is shown a sectional view of a server rack 6 which stores a plurality of electronic devices and a data center 1 equipped with a plurality of server racks. FIG. 2 indicates a top view of the data center 1.

As shown in FIG. 1, the air intake opening 2 which takes in an outside air, the air exhaust opening 3 which discharges the outside air and the circulation FAN 10 are being installed in the data center 1. A plurality of pieces of vaporizer 4 having the refrigerant 16 filled inside them are installed in the rear face of the server rack 6 arranged in the center part of the data center 1, from the upper part to the lower part of the server rack 6. It is desirable to provide the vaporizer 4 in a manner corresponding to each server rack. As shown in FIG. 2, a plurality of server racks which are constituted by a plurality of servers stacked vertically are being arranged laterally. A cooling system shown in FIG. 3 is provided for each server rack respectively.

Pieces of temperature sensor 7 for measuring an exhaust temperature from servers are installed in the server side portions of these plurality of vaporizers, and pieces of temperature sensor 7 for measuring an air temperature after heat exchange are installed in portions of the vaporizers in the room interior side of the data center 1.

A low-boiling-point refrigerant 16 such as hydrofluorocarbon and hydro-fluoro ether is used as the refrigerant 16 used in the vaporizer 4. The vaporizer 4 is connected to the condenser 5 in the condensing chamber 11 via the steam pipe 8 through which mainly vapor passes to the condensing chamber 11 provided inside the data center 1. From the condenser 5, the condenser pipe 9 through which a condensate liquid having phase-changed to liquid from vapor in the condenser 5 passes communicates with the vaporizer 4, and thus the vaporizer 4 and the condenser 5 are connected through the steam pipe 8 and the condenser pipe 9.

Both of the vaporizer 4 and the condenser 5 are heat exchangers to perform heat exchange between air and the refrigerant 16, and, for example, a heat exchanger of a fin and tube type is used. Although not illustrated in FIG. 1, the condensing chamber 11 is provided with an air intake opening and an air exhaust opening, and a condensation FAN which promotes heat exchange between air and the refrigerant 16 is installed in the condenser 5.

A plurality of pieces of vaporizer 4 are arranged vertically as described above, and the tank 13 that stores the refrigerant 16 is installed in each vaporizer as shown in FIG. 3. The tank 13 of the vaporizer 4 of the uppermost stage part is connected to the condenser 5 shown in FIG. 1 and FIG. 3 through the condenser pipe 9. The tank 13 are connected with the vaporizer 4 through the heat exchanger connecting pipe 14, and the pieces of tank 13 are connected with each other through the tank connecting pipe 15. Meanwhile, a desirable structure is that the heat exchanger connecting pipe 14 is movable or elastic corresponding to an up-and-down movement of a tank mentioned later. Pieces of steam pipe 8 of respective pieces of vaporizer 4 are brought together to one piece, and then connected to the condenser 5 as shown in FIG. 3.

Figure 4:
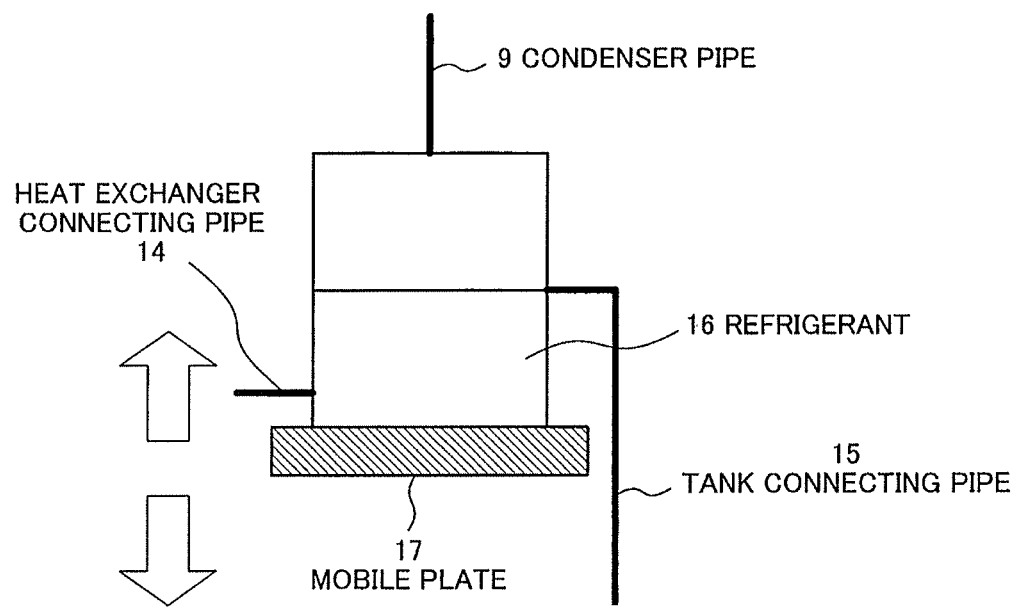
FIG. 4 is a diagram showing a structure of a mobile tank.

Each piece of tank 13 is installed on and fixed to a mobile plate 17 which can change its height in the vertical direction of the tank 13 as shown in FIG. 4. This mobile plate 17 moves up and down by converting motive power of a driving machine such as a motor into a force in the vertical direction. Operations of this driving machine are controlled by a control unit which is not illustrated. Based on temperature information obtained from the temperature sensor 7, the control unit performs a tank up-and-down movement mentioned later and power control of a circulation fan 10. By the tank 13 operating up and down, a height of the refrigerant 16 in the vaporizer 4 connected to the tank changes.

Next, control of a circulation fan using the temperature sensor 7 and control of the cooling performance of a heat receiving part will be described. An exhaust air temperature of a server rises by increase of a load of the server in time series. When the exhaust temperature of a server is 40 degree C. or more, for example, an intake air of a server will absorb an exhaust air directly due to a short return phenomenon mentioned above in which an exhaust air of a server turns around the server rack 6.

Many electronics manufacturers standardize to set the entrance air temperature of a server to 40 degree C. or less, and thus the operational reliability of a server is damaged if nothing is done. Accordingly, when the temperature sensor 7 of a heat receiving part in the side of the data center 1 becomes 40 degree C. or more, a control unit performs an operation which makes a driving machine raise a refrigerant height inside the heat receiving part by making the mobile plate of the tank 13 rise in order to make cooling performance of the heat receiving part be improved.

When a refrigerant height is made to rise, heat exchange becomes easy as a result of using a whole heat receiving part, and the exhaust temperature that has become 40 degree C. or more becomes 40 degree C. or less by enhanced heat exchange. At the same time, the control unit reduces motive power of the circulation FAN 10 to make a short return mentioned above be easy to occur. Although the entrance air temperature of a server goes on rising when a short return is caused, a rise of the entrance air temperature of the server is suppressed because heat exchange has become easy to be performed at the same time.

However, cooling performance of a heat exchanger has its own limitation. Such cooling performance can be expressed in a temperature difference ($\Delta T$) between the temperature sensor 7 in the server side and the temperature sensor 7 in the data center 1 side. When a temperature rise inside a server is 10 and $\Delta T$ mentioned above is 5 degree C., for example, cooling performance is said that 50% of heat is being absorbed. The maximum value of this $\Delta T$ is decided by the area and the thickness of a heat exchanger. Accordingly, decline of motive power of the circulation FAN 10 mentioned above is controlled by a control unit such that it is conducted until the performance of the heat exchanger reaches the maximum value of $\Delta T$.

Many servers have a standard value of 15 degree C. for an intake air temperature of a server also in the low temperature side. In the case of midwinter, an outside temperature of the data center 1 becomes 15 degree C. or less, and thus it is necessity to heat air in order to make the intake air temperature of a server be no smaller than 15 degree C. In this case, heat generation of a server itself is used. When the temperature of the temperature sensor 7 in the data center 1 side is no more than 15 degree C., the control unit makes the mobile plate of the tank 13 descend.

By this movement, a liquid level inside the heat receiving part is declining. When a liquid level declines, heat exchange is suppressed because an area where a heat receiving part is filled with the refrigerant 16 goes on becoming smaller. The descent of this liquid level is made until the refrigerant 16 inside the heat receiving part disappears. Around the same time with this movement of the mobile plate, the control unit makes the motive power of the circulation FAN 10 goes on being lowered. When the motive power of the circulation FAN 10 is declining, an intake air temperature of the server is rising because an amount of an exhaust air of the server that is supplied to an intake air of the server directly goes on increasing by a short return mentioned above. At the time point when an intake air temperature of the server becomes 15 degree C., decline of the motive power of the circulation FAN 10 is stopped and it is operated at the motive power at that time.

An effect by the above-mentioned action exists in a point that temperature control can be performed for each server to which a vaporizer is provided because the performance of an individual evaporator can be controlled. In addition, temperature control is made by controlling a movement which is an up-and-down movement of a tank that is easy to be controlled, and thus the system is not complicated.

Figure 5:
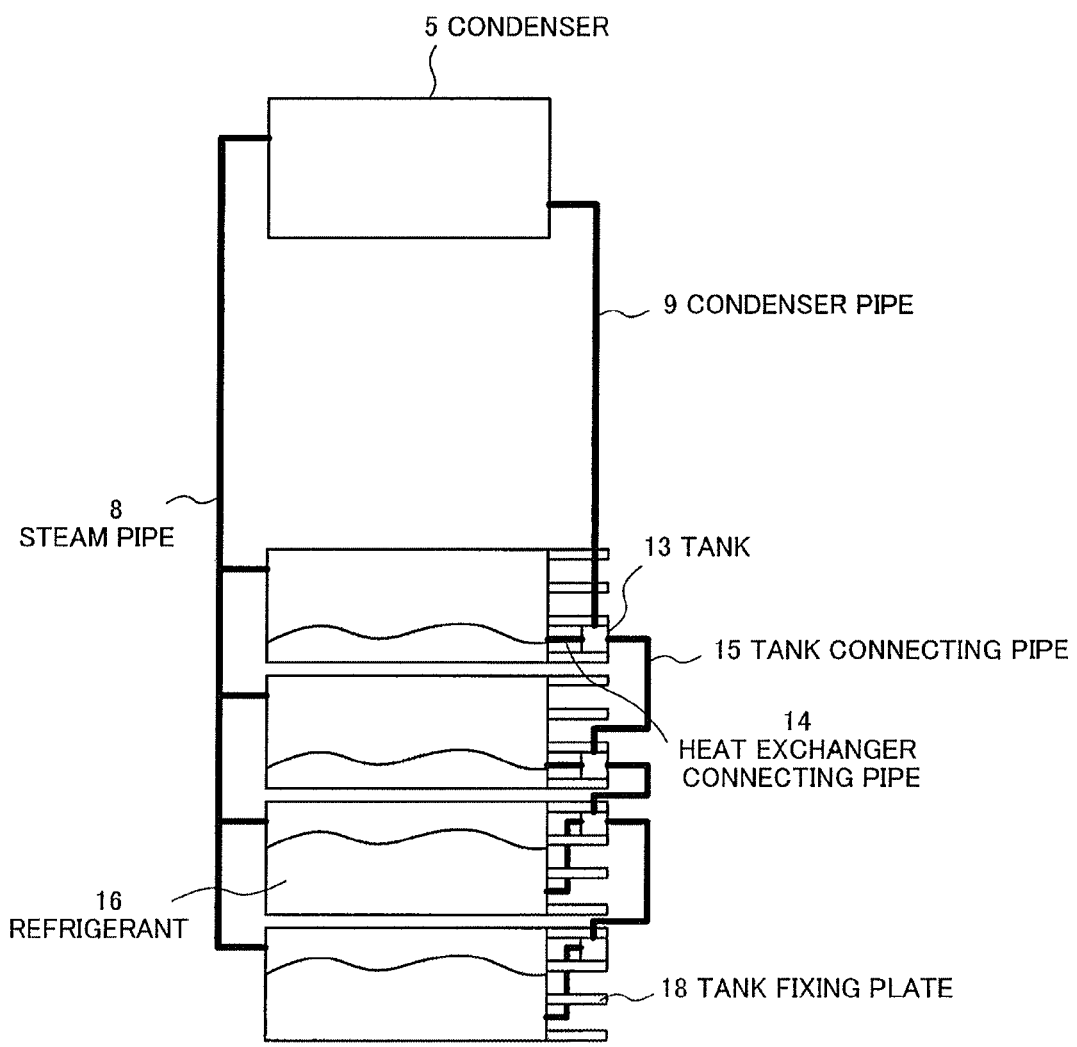
FIG. 5 is a diagram showing a cooling system of a second exemplary embodiment.
Figure 6:
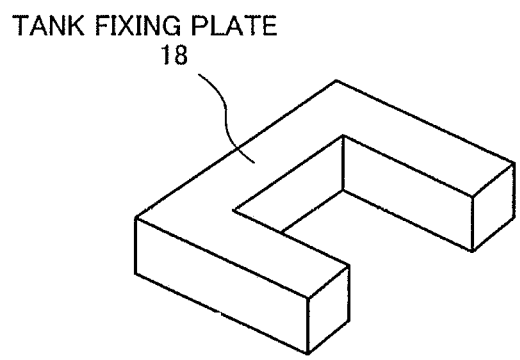
FIG. 6 is a detail view of a tank fixing plate.

Next, the second exemplary embodiment will be described using a drawing. Structures overlapping with the first exemplary embodiment are omitted. A difference from the first exemplary embodiment in the second exemplary embodiment is a point that a mechanism to adjust a liquid level of the tank 13 is carried out by a tank fixing plate 18, not by the mobile plate 17, as shown in FIG. 5. A plurality of pieces of tank fixing plate 18 are connected to a side face of a vaporizer. As shown in FIG. 6, the tank fixing plate 18 has a hollow cutout enabling to fix the tank 13. As shown in FIG. 5, adjustment of a liquid level of a heat receiving part is performed by varying a position to mount the tank 13 in the vertical direction among a plurality of pieces of tank fixing plate 18.

In the case of the second exemplary embodiment, it is necessary to move the tank 13 optionally by a human hand, and, thus, detailed control of a liquid level and the circulation FAN 10 corresponding to a load of a server as is the case with the first exemplary embodiment cannot be realized. Therefore, it is necessary to decide positions of the tank 13 in a high temperature period in summer and a low temperature period in winter, for example, in advance, and move the tank 13 beforehand. Effects are similar to those of the first exemplary embodiment.

Figure 7:
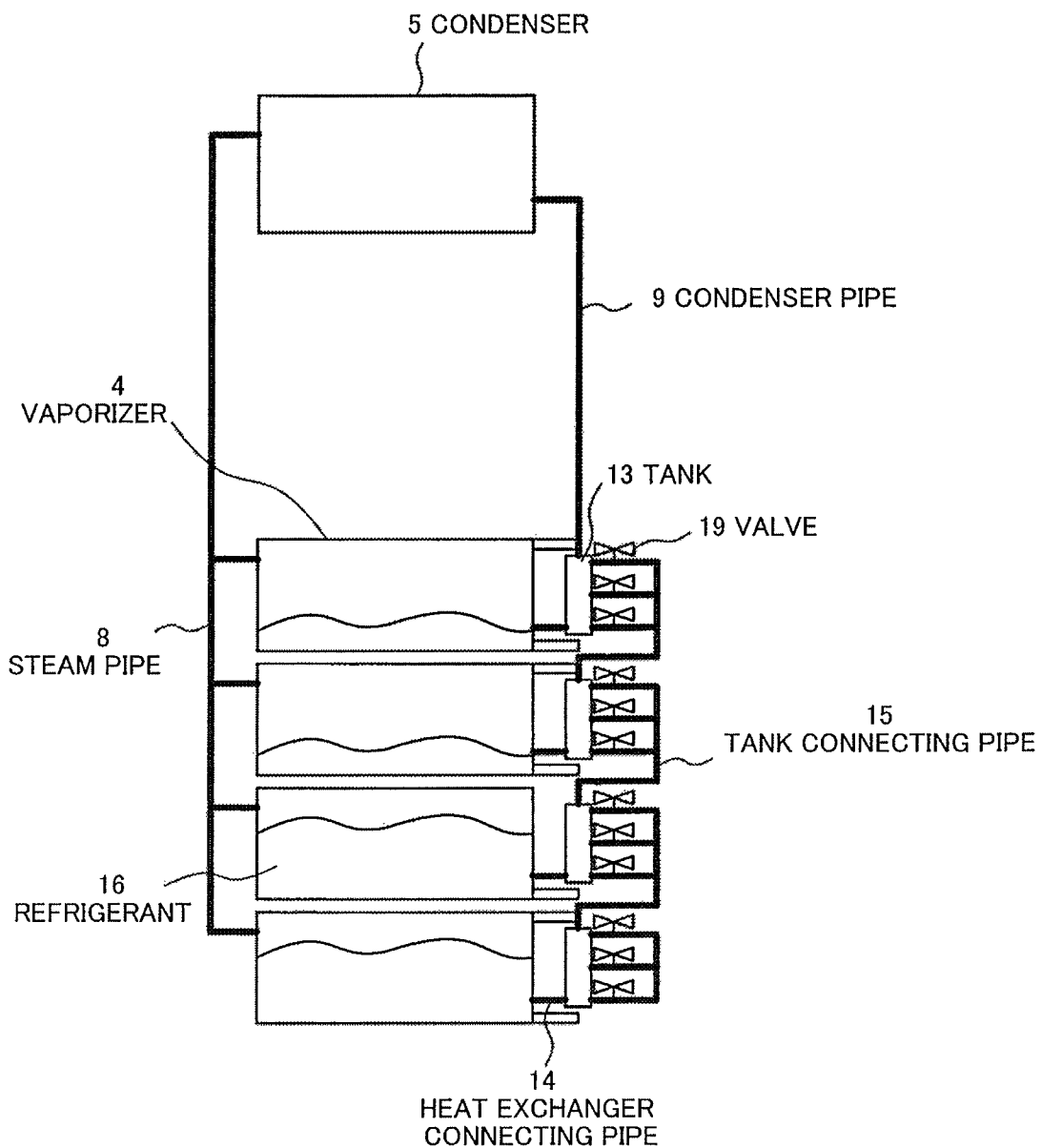
FIG. 7 is a diagram showing a cooling system of a third exemplary embodiment.

Next, the third exemplary embodiment will be described using a drawing. Structures overlapping with the first exemplary embodiment are omitted similarly. A difference from the first exemplary embodiment in the third exemplary embodiment is a point that a mechanism to adjust a liquid level of the tank 13 is realized by a fluid control valve 19 as shown in FIG. 7. In the tank 13, there are provided a plurality of pieces of fluid control fluid control valve 19 in the vertical direction of the tank 13. When it is desired to make a liquid level of a heat receiving part rise, by opening the fluid control valve 19 of the uppermost part shown in FIG. 7 and by closing the remaining two pieces of fluid control valve 19, for example, a condensate liquid reaches the tank 13 in a lower stage when the liquid level reaches the fluid control valve 19 of the uppermost part.

In this exemplary embodiment, control of a liquid level of a heat receiving part is performed by control of the fluid control valve 19, not by a form according to an up-and-down movement of the mobile plate 17. Regarding control of a valve, a control unit can carry out control of a valve automatically according to temperature information from a temperature sensor just like the first exemplary embodiment. Alternatively, a valve may be adjusted by human hands as is the case with the second exemplary embodiment.

This application claims priority based on Japanese application Japanese Patent Application No. 2012-264430, filed on Dec. 3, 2012, the disclosure of which is incorporated herein in its entirety.

INDUSTRIAL APPLICABILITY

The present invention relates to a cooling system for such as an electronic device storing apparatus, and, more particularly, to a cooling system for such as an electronic device storing apparatus which cools heat from a plurality of heating sources such as a server.

REFERENCE SIGNS LIST

1 Data center
2 Air intake opening
3 Air exhaust opening
4 Vaporizer
5 Condenser
6 Server rack
7 Temperature sensor
8 Steam pipe
9 Condenser pipe
10 Circulation FAN
11 Condensing chamber
12 Condensation FAN
13 Tank
14 Heat exchanger connecting pipe
15 Tank connecting pipe
16 Refrigerant
17 Mobile plate
18 Tank fixing plate
19 Fluid control valve

The invention claimed is:

1. A cooling system for an electronic device storing apparatus, comprising:
a rack including a plurality of placement shelves to place an electronic device;
a plurality of vaporizers having a refrigerant internally and being mounted in said rack;
a condensing part being installed outside said rack and connected with said plurality of vaporizers by a laying pipe;
a plurality of tanks, each storing said refrigerant and being connected to each of said plurality of vaporizers by a heat exchanger connecting pipe;
a plurality of tank connecting pipes connecting said plurality of tanks;
a condenser pipe connecting one of said plurality of vaporizers and said condensing part; and
a refrigerant adjustment means for adjusting a height of refrigerant surface in said plurality of vaporizers,
wherein said refrigerant adjustment means has a means for controlling a height of said plurality of tanks.

2. The cooling system of an electronic device storing apparatus according to claim 1,
wherein said refrigerant adjustment means is provided with a plurality of fluid control devices each being connected to said condensing part and being connected to a different height of said plurality of tanks.

3. The cooling system of an electronic device storing apparatus according to claim 1, comprising
a temperature sensor to detect temperature of said rack; and, according to a detection result of said temperature sensor, controlling said refrigerant adjustment means for adjusting a height of said refrigerant surface.

4. A cooling system for an electronic device storing apparatus, comprising:
a rack including a plurality of placement shelves to place an electronic device, said rack being arranged in a building, being installed with a plurality of air intake openings and air exhaust an outside air;
a plurality of vaporizers, each vaporizer having a refrigerant internally and being mounted in said rack;
a condensing part begin installed outside said rack and connected with said plurality of vaporizers by a laying pipe;
a plurality of tanks, each storing said refrigerant and being connected to each of said plurality of vaporizers by a heat exchanger connecting pipe;
a plurality of tank connecting pipes connecting said plurality of tanks;
a condenser pipe connecting one of said plurality of vaporizers and said condensing part; and
a refrigerant adjustment means for adjusting a height of a refrigerant surface in said plurality of vaporizers,
wherein said refrigerant adjustment means has a means for controlling a height of said plurality of tanks.

5. The cooling system of an electronic device storing building according to claim 4, wherein a fan is provided in an air exhaust opening of said electronic device storing building.

6. The cooling system of an electronic device storing building according to claim 4,
wherein a temperature sensor to detect temperature of said rack is provided, and, according to a result of said temperature sensor, output of said fan of said electronic device storing building and said refrigerant adjustment means are controlled.

* * * * *